United States Patent
Pepe et al.

(10) Patent No.: US 7,239,012 B2
(45) Date of Patent: Jul. 3, 2007

(54) THREE-DIMENSIONAL MODULE COMPRISED OF LAYERS CONTAINING IC CHIPS WITH OVERLYING INTERCONNECT LAYERS

(75) Inventors: Angel Pepe, Rancho Palos Verdes, CA (US); James Yamaguchi, Laguna Niguel, CA (US)

(73) Assignee: Irvine Sensors Corp., Costa Mesa, CA (US)

( * ) Notice: Subject to any disclaimer, the term of this patent is extended or adjusted under 35 U.S.C. 154(b) by 42 days.

(21) Appl. No.: 10/951,990

(22) Filed: Sep. 28, 2004

(65) Prior Publication Data
US 2005/0037540 A1 Feb. 17, 2005

Related U.S. Application Data

(63) Continuation of application No. 09/938,686, filed on Oct. 30, 2001, now Pat. No. 6,797,537.

(51) Int. Cl.
H01L 23/02 (2006.01)
H01L 23/58 (2006.01)
H01L 23/48 (2006.01)

(52) U.S. Cl. .................. 257/686; 257/48; 257/737; 257/777; 257/778

(58) Field of Classification Search ............... 257/620, 257/685, 686, 723, 777, 778, 48, 737
See application file for complete search history.

(56) References Cited

U.S. PATENT DOCUMENTS 6,548,330 B1 * 4/2003 Murayama et al. .......... 438/127

* cited by examiner

*Primary Examiner*—Hung Vu
(74) *Attorney, Agent, or Firm*—W. Eric Boyd, Esq.

(57) ABSTRACT

A pre-formed integrated circuit chip-containing module formed from layers is disclosed. Each layer contains an integrated circuit chip that is encapsulated into an electronic package, by forming an interconnect assembly separately from the pre-formed integrated circuit chip. If the interconnect assembly tests good it is bonded to the prepared integrated circuit chip. The interconnect assembly is flip bonded to the chip. The interconnect assembly and chip are passivated or potted into an integral structure to provide the electronic package. At least one test pad is defined in an interconnect layer, which test pad can be accessed and electrically connected on opposing sides of the test pad. The chip is underfilled with an insulating material to remove all voids between the chip and the interconnect assembly. The integrated circuit chip is then thinned. The test pad is accessed to test the chip. A plurality of interconnect assemblies and chips are bonded together to form a corresponding plurality of electronic packages. Each layer is bonded to form a stack of integrated circuit containing layers.

2 Claims, 12 Drawing Sheets

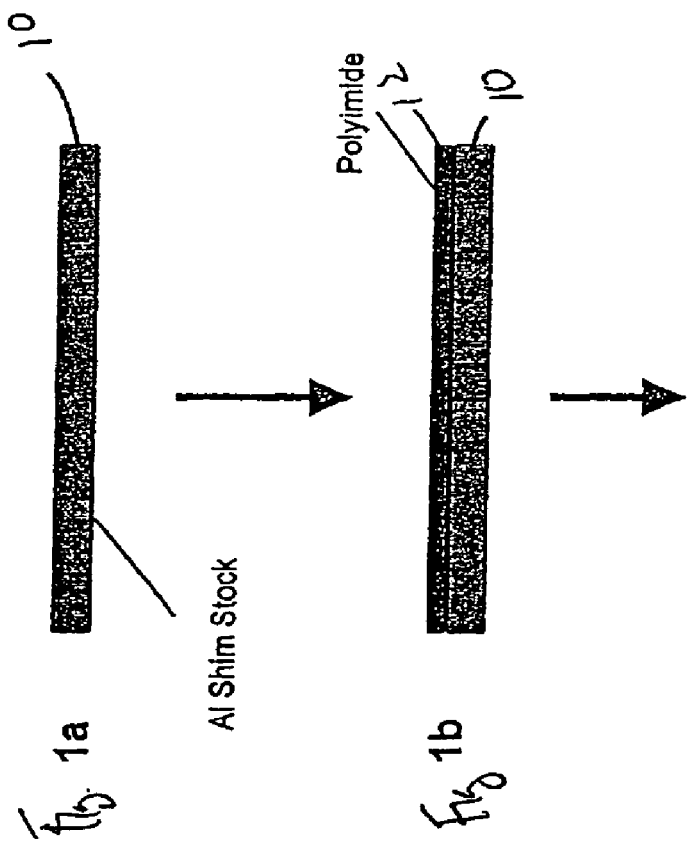

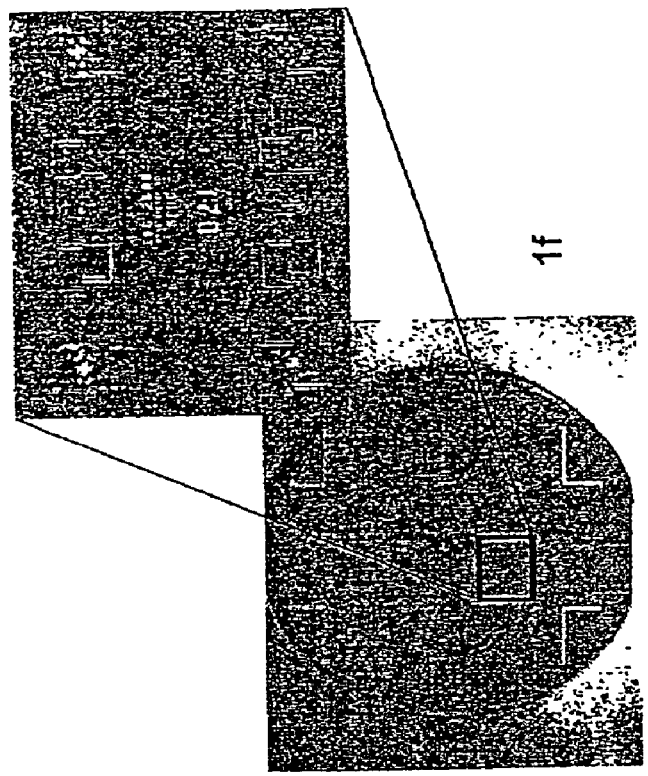
1c) Apply field metal
1d) Apply photoresist
1e) Gold electroplate
1f) Strip photoresist & field metal etch
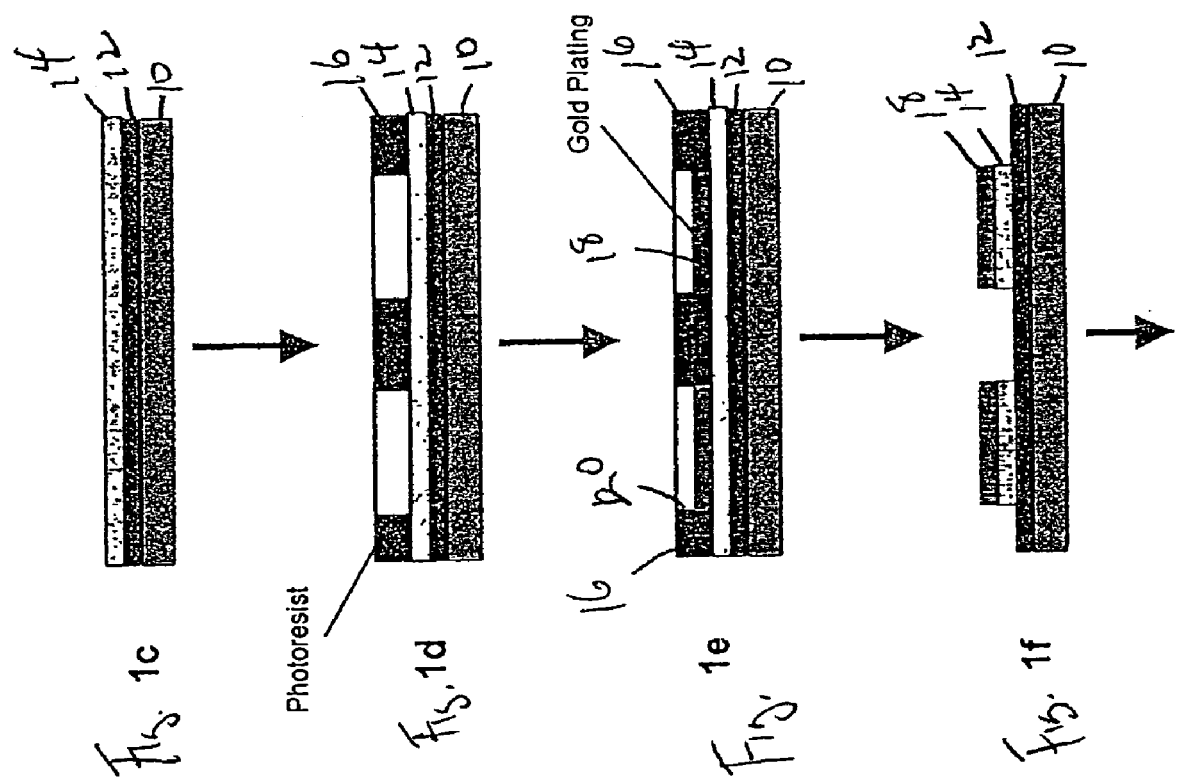

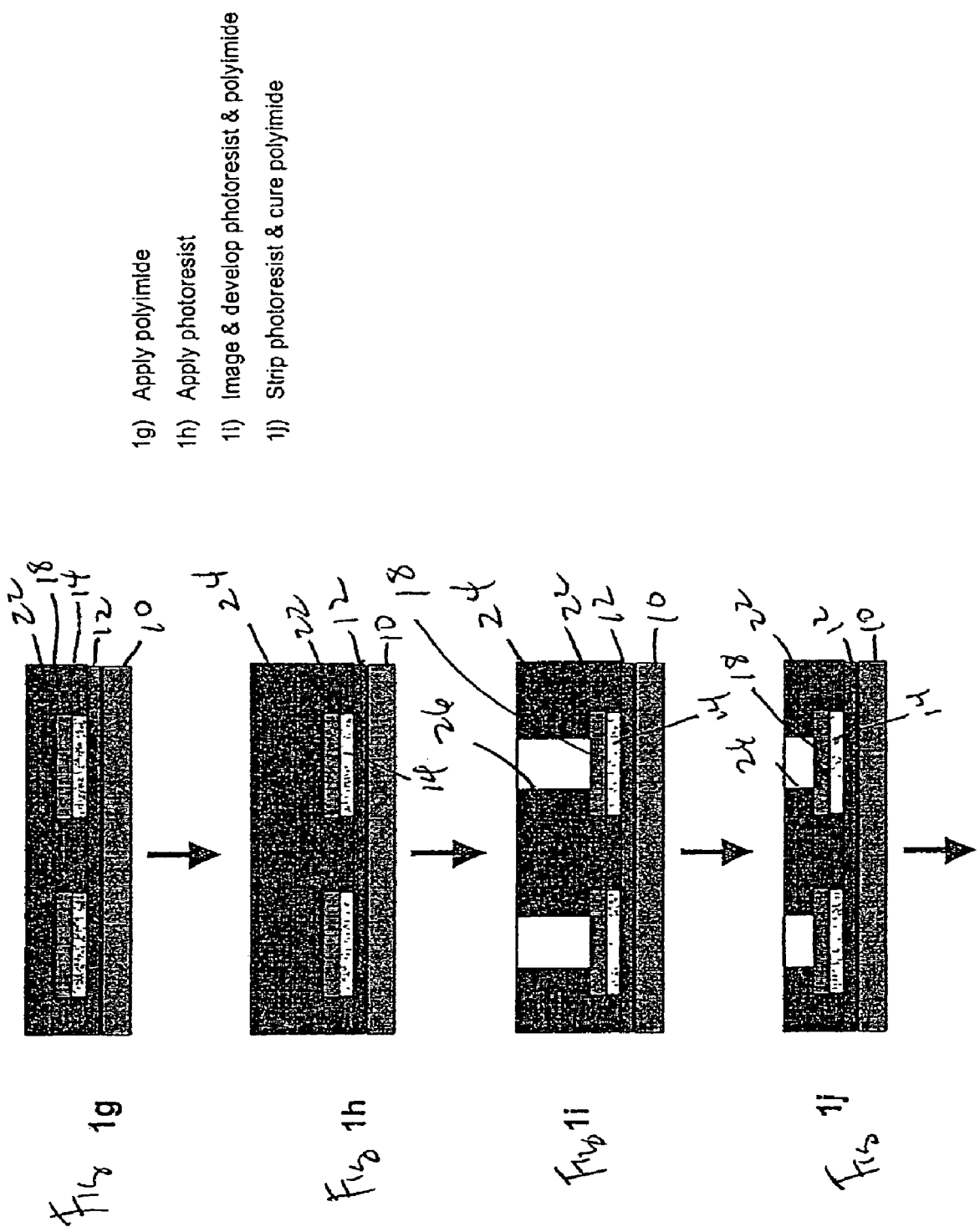

1k) Apply field metal
1l) Apply photoresist
1m) Image & develop photoresist. Gold electroplate
1n) Strip photoresist & field metal etch NOTE: For additional layers, steps 1g through 1n are repeated.

Solder Bumping Of Die
Fig. 2a
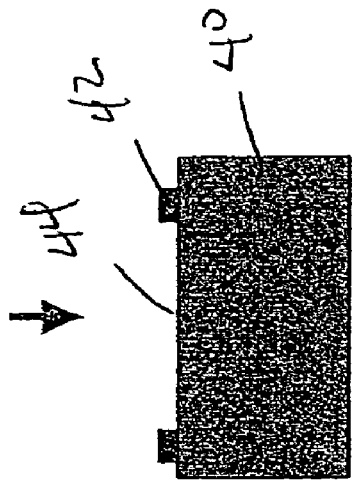
Fig. 2b
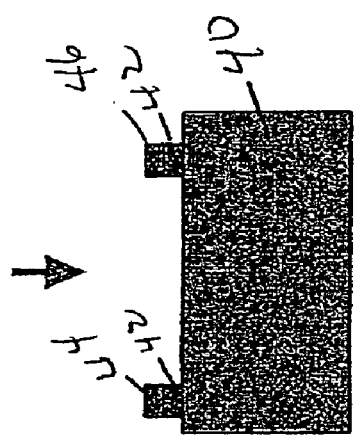
Fig. 2c
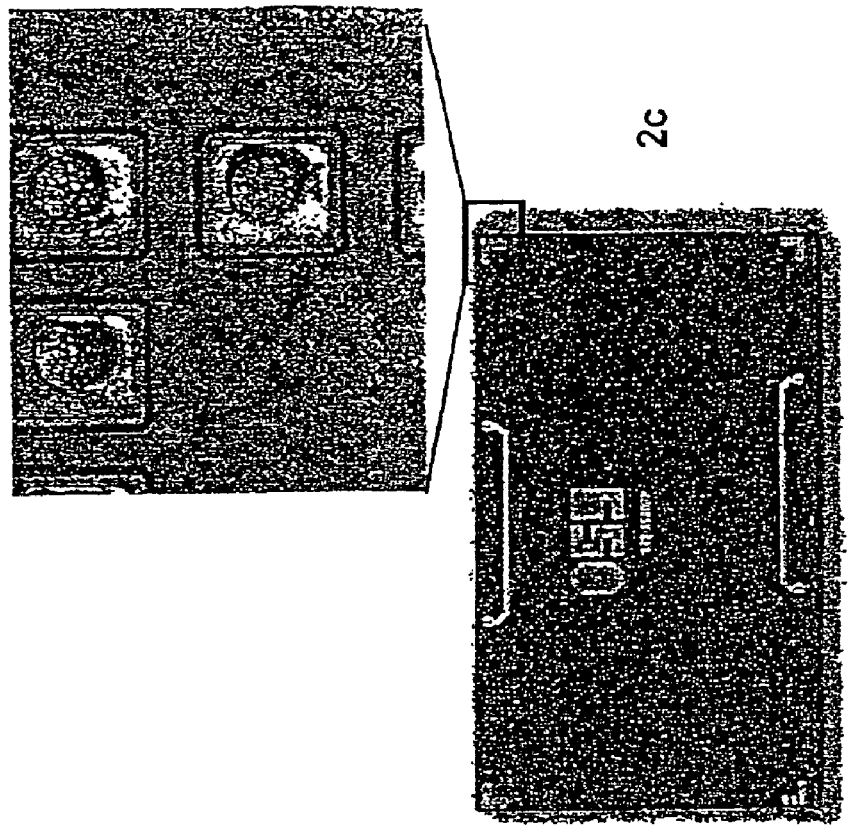
2a) Retrieve die
2b) Apply underbump metalurgy
2c) Apply solder bump

Flip-Chip Bonding

3a) Flip chip bumped die to substrate

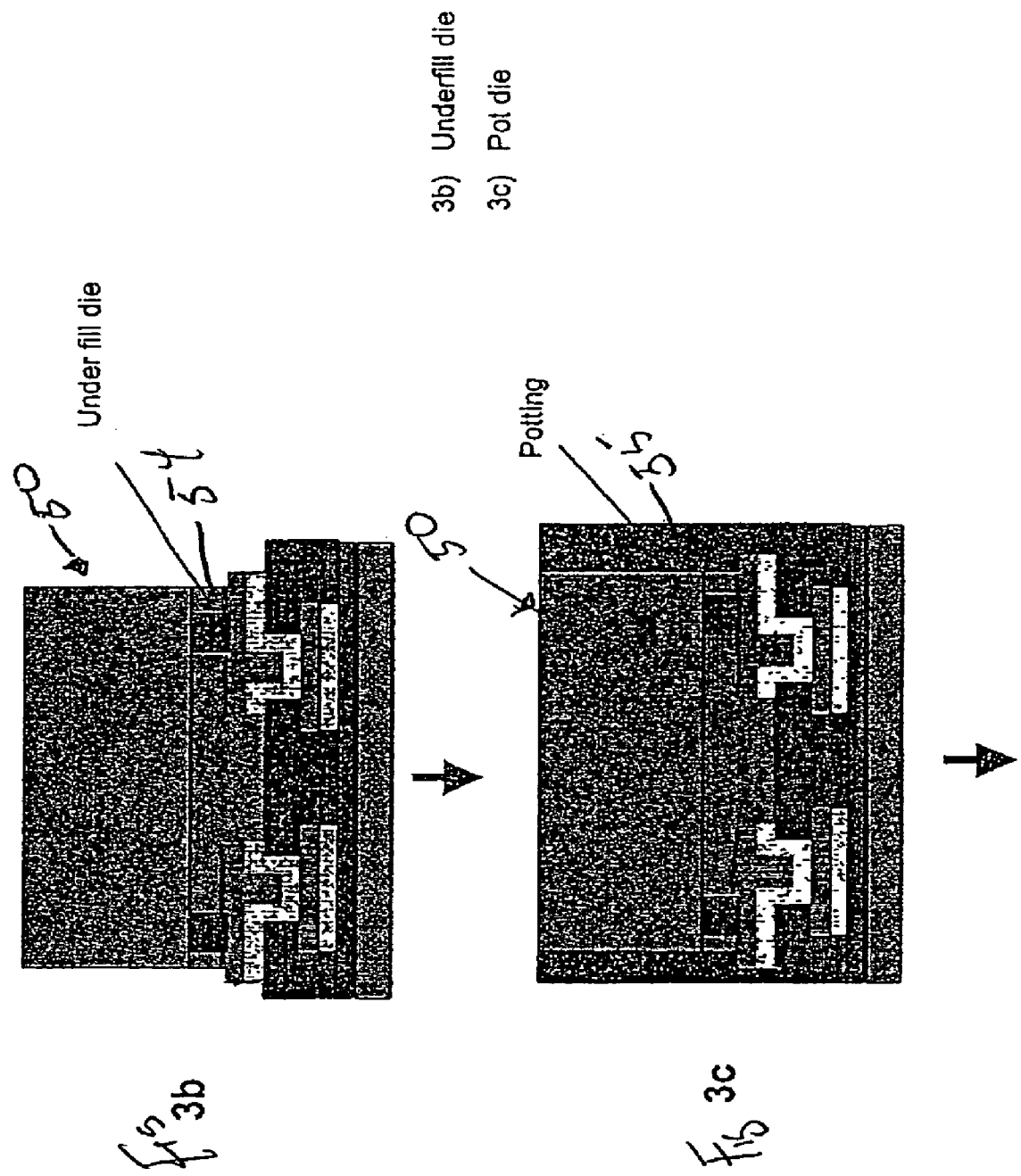

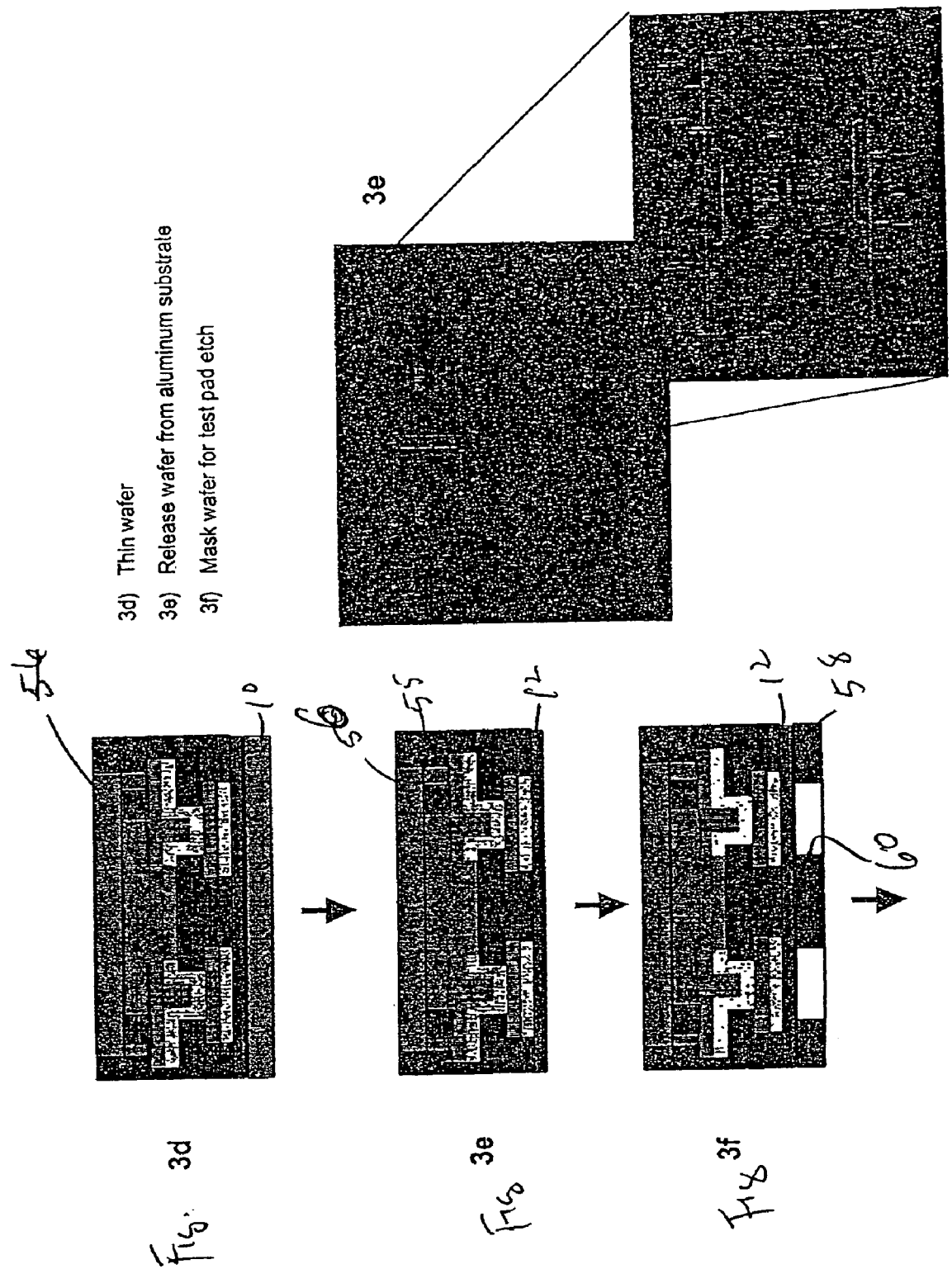

3g) Etch polyimide to expose test pads
3h) Remove etch mask & test wafer
3i) Dice wafer

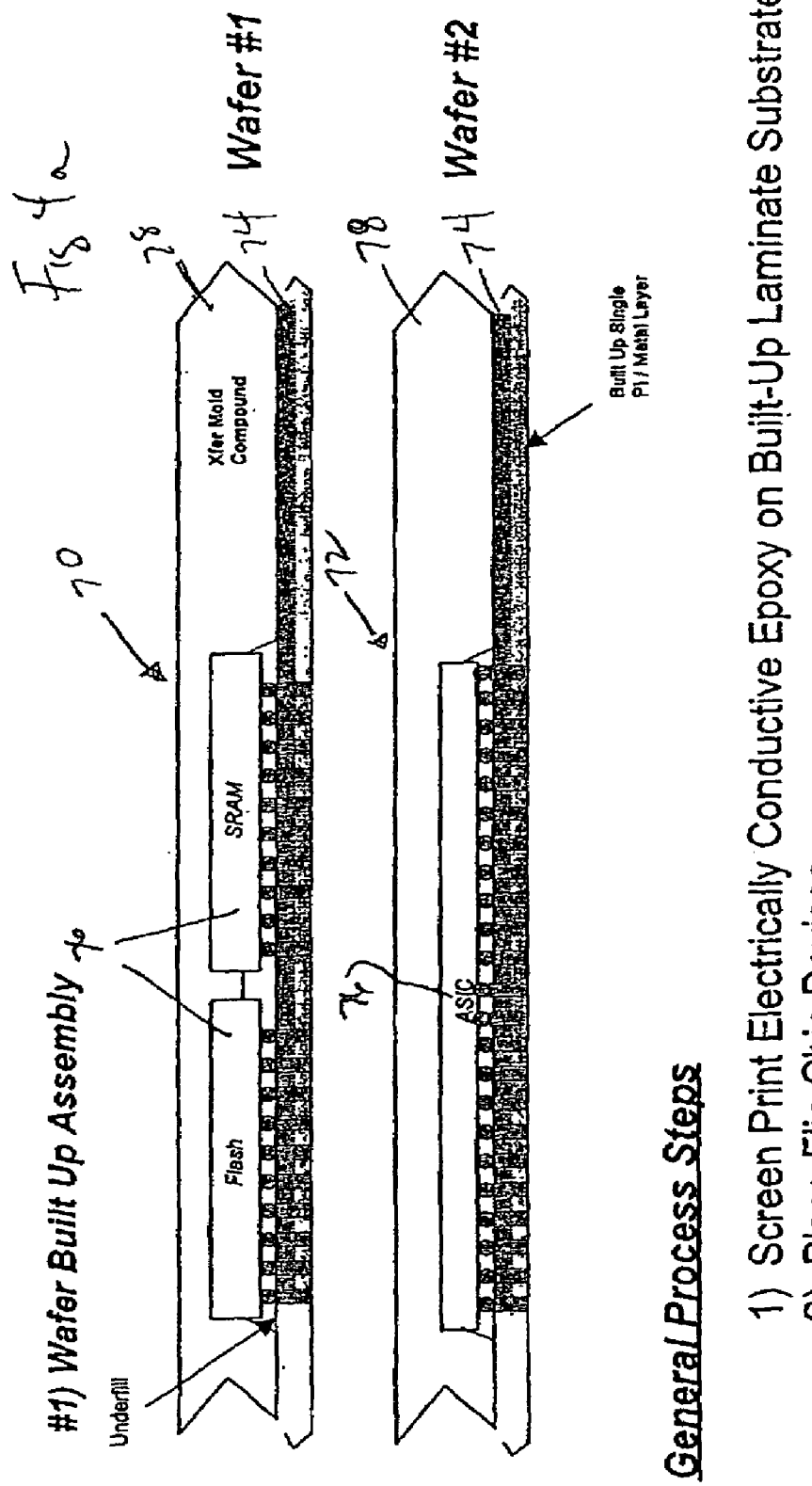

General Process Steps
6) Release Carrier Film from Substrate (If Required)
7) Attach Memory and ASIC Wafers
8) Cut/Saw Wafers to Strips
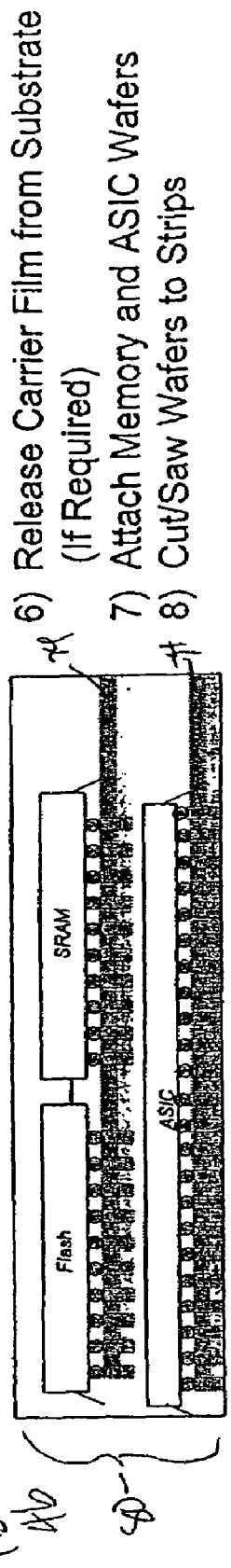
2) Stacked Wafer Strip Assembly
General Process Steps
9) Interconnect or Bus Wafers by Metallizing Wafer Stacks
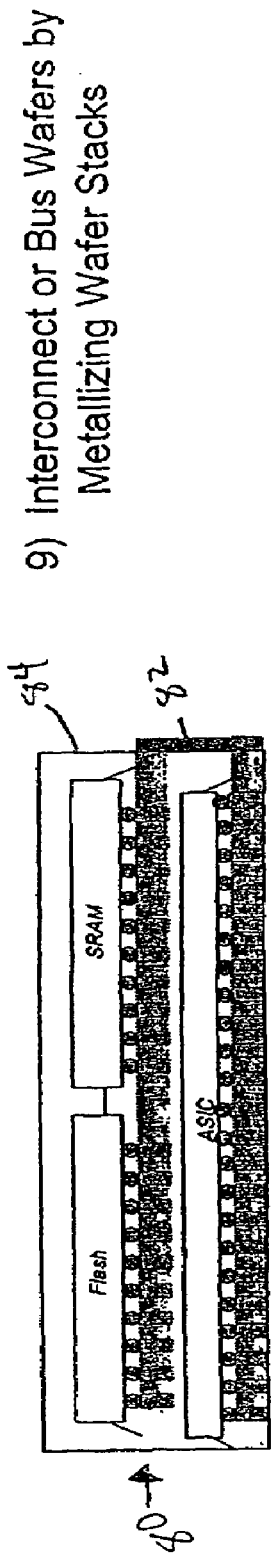
3) Stacked Wafer Strip Assembly

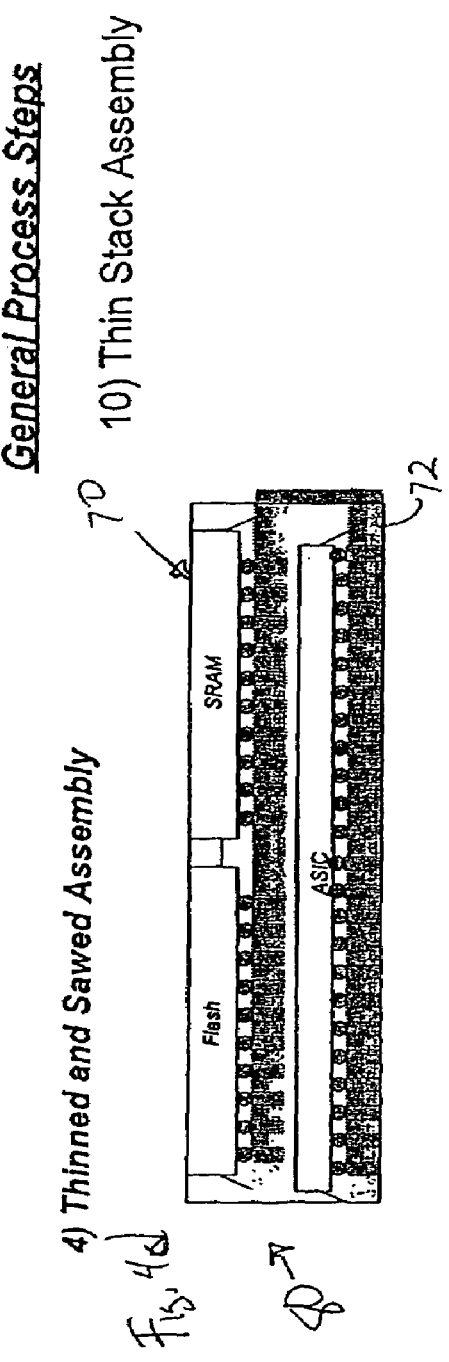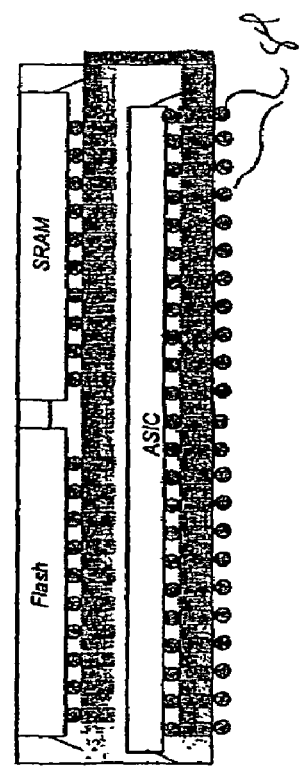

THREE-DIMENSIONAL MODULE COMPRISED OF LAYERS CONTAINING IC CHIPS WITH OVERLYING INTERCONNECT LAYERS

REFERENCE TO RELATED APPLICATIONS

This application is a continuation of U.S. application Ser. No. 09/938,686, filed on Oct. 30, 2001 now U.S. Pat. No. 6,797,537.

BACKGROUND OF THE INVENTION

1. Field of the Invention

This invention relates to the dense packaging of electronic circuitry, and specifically to the stacking of integrated circuit (IC) chips, or die.

2. Description of the Prior Art

Stackable IC chip layers were disclosed in U.S. Pat. No. 5,953,588 which permit chips having different functions and therefore different areas to be stacked as if they were same size chips, using stacking and electrical connection techniques and tools which have been developed for same size chips. The new units were referred to as "neo" (or "pseudo" or "virtual") chips. In addition to the advantage of being able to use chips of varying sizes in a given stack, that technology permits the processing and stacking of chips purchased as individual die, which are more readily available than chips purchased in wafer form. Furthermore, the chips purchased as individual die are generally "known good" die, which have been "burned in", and are therefore pre-tested prior to stacking.

A re-wafering process is used, in which a neo-wafer is formed encapsulating known good chips, so that the chips can be prepared for stacking by covering their active surfaces with a dielectric layer, forming vias through the dielectric layer to reach the terminals on the respective chips, and metallizing to provide electrical connections from the chip terminals to side surfaces of the layer, which are created when the neo-wafer is diced, or sliced, to provide individual layers ready for stacking.

Prior to this technology the extra steps required preparatory to stacking were sometimes carried out while the chips were still in their original wafer form. The wafer concept is almost universally used to simultaneously form integrated circuits (ICs) in numerous locations in the wafer, so that a multiplicity of separate IC chips will be created when the wafer is diced. Since preparation for stacking requires that the chip surfaces be metalized to connect their terminals to suitable access planes on the stack, manufacturing steps beyond the normal wafer processing steps are required, if stacking is intended. In some cases, chips in TSOP (packaged) form have been electrically connected to external circuitry by means of metal frames which are formed as part of the TSOP structure.

In this process the chips which have been previously formed in a wafering process, and tested to insure their performance, need to be re-wafered, so they can be processed for subsequent stacking. Even in the case of a single chip, it is not feasible to perform the pre-stacking processing steps without using a neo-wafer, which proves a large enough body to permit efficient handling. Of course, the manufacturing process is much more cost effective if the neo-wafer contains a plurality of pre-formed, pre-tested chips which can be simultaneously prepared for stacking. The neo-wafer is subsequently diced to form individual layers ready for stacking. In effect, two wafering and dicing processes are used to facilitate stacking of chip-encapsulating layers.

The primary challenge in using a neo-wafer containing multiple die is the accurate location of each die. With multiple die in the wafer, the accuracy necessary to locate each die prior to potting creates a potential alignment problem.

The re-wafering process was improved in U.S. Pat. No. 6,117,704 by making location of chips (die) in the neo-wafer highly accurate, and by making it more feasible to include multiple chips in the neo-wafer. The neo-wafer is so structured that each chip it contains is precisely located by use of a single masking step to obtain exact location of the known good chips, which are inserted in the neo-wafer and then covered by potting material. Then the chips in the neo-wafer are simultaneously processed to prepare them for stacking. They are stacked after they have been diced from the neo-wafer.

Since, with the present invention, the locations of the chips in the neo-wafer are controlled by photo patterning (photo-lithography), their relative locations are determined with the very high precision inherent in the use of a single mask to control the locations of all chips in the neo-wafer.

Another advantage of the improved process is that any leakage of potting material onto the active (upper) surfaces of the chips in the neo-wafer does not affect the electrical terminals on the chips, so that removal of any such leaked material is not required, and increased reliability of the electrical connection is obtained.

The benefits of the improved prior art are obtained by using a wafer frame, sometimes called a "picture frame", having a plurality of separate chambers, or cavities, into which the individual known good chips are inserted. The chips have conductive bumps which extend into and through pre-formed small holes (vias) in the surface of the wafer frame. The via holes have been formed using photo-lithography with a single mask for the entire neo-wafer, thus insuring precise location of the via holes relative to one another. This insures precise location of the separate chips relative to one another, and provides terminals accessible for electrical connections.

BRIEF SUMMARY OF THE INVENTION

The invention is a method of preparing a pre-formed integrated circuit chip for encapsulation in an electronic package, comprising the steps of forming an interconnect assembly separately from the pre-formed integrated circuit chip; forming a plurality of conductive bumps connected to the terminals of the integrated circuit chip; bonding the interconnect assembly to the prepared integrated circuit chip; and passivating the bonded interconnect assembly and the prepared integrated circuit chip into an integral structure to provide the electronic package.

The step of forming an interconnect assembly comprises forming the interconnect assembly on a releasable substrate.

The step of forming an interconnect assembly comprises forming at least one test pad in an interconnect layer, which at least one test pad can be accessed and electrically connected on opposing sides of the test pad.

The step of forming at least one test pad forms a test pad having gold on opposing sides of the test pad and sandwiched there between a conductive field metal.

The step of forming an interconnect assembly comprises forming at least one test pad in a plurality of stacked interconnect layers, each of which at least one test pad in each interconnect layer can be accessed and electrically connected on opposing sides of the test pad.

The step of forming a plurality of conductive bumps connected to the terminals of the integrated circuit chip form a metallic bump making connection to a terminal on the integrated circuit chip and a solder layer disposed on the metallic bump.

The step of forming an interconnect assembly comprises forming at least one test pad in an interconnect layer, which at least one test pad can be accessed and electrically connected on opposing sides of the test pad, and wherein the step of bonding the interconnect assembly to the prepared integrated circuit chip flip bonds the solder layer onto one side of the test pad.

The step of passivating the bonded interconnect assembly and the prepared integrated circuit chip into an integral structure to provide the electronic package comprises underfilling the prepared integrated circuit chip with an insulating material to remove all voids between the prepared integrated circuit chip and the interconnect assembly.

The step of passivating the bonded interconnect assembly and the prepared integrated circuit chip into an integral structure to provide the electronic package comprises potting the interconnect assembly and the prepared integrated circuit chip into an integral package.

The step of passivating the bonded interconnect assembly and the prepared integrated circuit chip into an integral structure to provide the electronic package comprises potting the interconnect assembly and the prepared integrated circuit chip into an integral package.

The method further comprises the step thinning the prepared integrated circuit chip.

The method further comprises the step of accessing the prepared integrated circuit chip through electrical connection to the at least one test pad through a surface thereof opposing the surface of the test pad contacting a terminal of the prepared integrated circuit chip to test the prepared integrated circuit chip.

A plurality of interconnect assembly and prepared integrated circuit chips are bonded together to form a corresponding plurality of electronic packages. In this case the method comprises the step of releasing the plurality of electronic packages from each other. The method further comprises the step of testing the interconnect assembly and bonding a tested interconnect assembly in the step of bonding the interconnect assembly to the prepared integrated circuit chip only if the interconnect assembly tested good. The step of forming the plurality of interconnect assemblies comprises forming the interconnect assemblies simultaneously in a wafer and individually bump bonding the plurality of prepared integrated circuit chips to successfully tested ones of the interconnect assemblies.

The invention further comprises an electronics package having a structure formed by the above method.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be acccorded full statutory equivalents under 35 USC 112. The invention can be better visualized by turning now to the following drawings wherein like elements are referenced by like numerals.

BRIEF DESCRIPTION OF THE DRAWINGS

FIGS. 2a-2c are diagrammatic side cross-sectional views which illustrate the steps of a method of solder bumping a die.

FIGS. 3a-3i are diagrammatic side cross-sectional views which illustrate the steps of a method of combining the interconnect layer of FIGS. 1a-1n with the die assembly fabricated in FIGS. 2a-2c.

FIGS. 4a-4c are diagrammatic side cross-sectional views which illustrate the methodology as used for high volume manufacturing.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

A pre-formed integrated circuit chip is encapsulated into an electronic package, by forming an interconnect assembly separately from the pre-formed integrated circuit chip. If the interconnect assembly tests good it is bonded to the prepared integrated circuit chip. The interconnect assembly is flip bonded to the prepared integrated circuit chip. The bonded interconnect assembly and the prepared integrated circuit chip are passivated or potted into an integral structural to provide the electronic package. At least one test pad is defined in an interconnect layer, which test pad can be accessed and electrically connected on opposing sides of the test pad. The prepared integrated circuit chip is underfilled with an insulating material to remove all voids between the prepared integrated circuit chip and the interconnect assembly. The prepared integrated circuit chip is then thinned. The test pad is accessed to test the prepared integrated circuit chip. A plurality of interconnect assembly and prepared integrated circuit chips are bonded together to form a corresponding plurality of electronic packages.

Figure 1K:
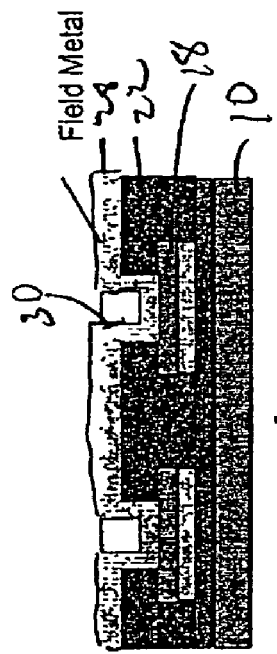
FIGS. 1a-1n are diagrammatic side cross-sectional views which illustrate the steps of a method of making an interconnect layer.
Figure 1L:
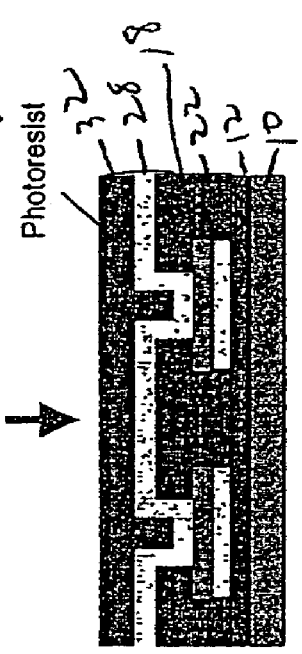
Figure 1M:
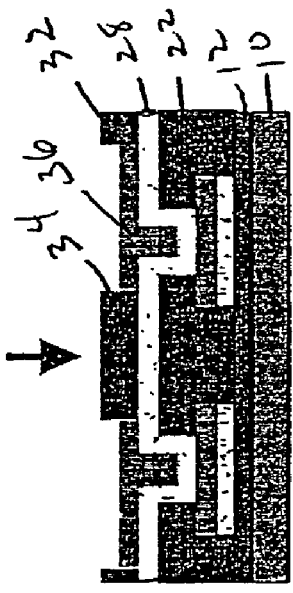
Figure 1N:
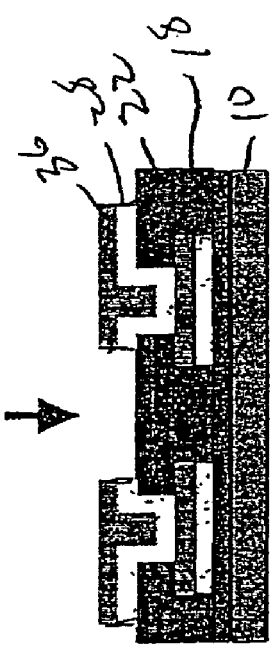

FIGS. 1a-1n are diagrammatic side cross-sectional views of what is called here a "reverse neo process". FIG. 1a begins with the preparation of aluminum shim stock 10. In the illustrated embodiment of aluminum shim stock is approximate 30 mils in thickness. As shown in FIG. 1b a polyimide layer 12 is then disposed on aluminum layer 10. The polyimide layer is cured. In FIG. 1c a field metal layer 14 is applied on top of cured polyimide layer 12. Photoresist 16 is then disposed on metal layer 14 as shown in the side diagrammatic view of FIG. 1d and lithographically patterned according to conventional techniques. Gold or other conductive metal 18 is then disposed into openings and 20 defined in photoresist layers 16 as shown in FIG. 1e. The photoresist layer is then removed and field metal 14 etched leaving the structure depicted in FIG. 1f in which gold pads 18 are supported on field metal 14 on top of a polyimide coated aluminum shim 10.

In FIG. 1g a polyimide layer 22 is then disposed on gold pads 18 of FIG. 1f. A photoresist layer 24 is then disposed upon polyimide layer 22 as depicted in FIG. 1h.

Photo resist layer 25 is imaged and developed along with polyimide layer 20 to thereby define openings 26 through polyimide layer 24 and photoresist layer 22 to expose a selected portion of gold pad 18 as shown FIG. 1*i*. Thereafter, photoresist layer 24 is removed and polyimide layer 22 is cured leaving the structure shown in FIG. 1*j* in which openings 26 remain defined above gold pads 18.

A field in the layer metal 26 is then disposed on polyimide layer 22 into openings 26 which have been previously defined above gold pads 18 to create a field metal layer 28 in which pockets or wells 30 are defined. The resulting structure shown in FIG. 1*k*. A photoresist layer 32 is then disposed on top of field layer 28 as shown in FIG. 1*l*. Photoresist layer 32 is imaged and developed to define openings 34 into which a gold layer 36 is electroplated as shown in FIG. 1*m*. Photoresist layer 32 is hen stripped away and field layer 28 is etched to leave the resulting structure as shown in FIG. 1*n* in which there are gold contact pads 36 positioned on top polyimide layer 22, which gold contact pads 36 in turn are connected to gold pads 18 which are lying there below.

Thus, FIGS. 1*a*-1*n* depict the process by which a metalization layer is constructed. If additional metalization layers are desired, the steps of FIGS. 1*g*-1*n* can be repeated as many times as necessary to created additional stacked layers of interconnects. In practice 3 or 4 layers are usually the most number ever needed.

FIGS. 2*a*-2*c* represent the solder bumping of the die. For example, beginning in FIG. 2*a*, a die 40 is obtained from a semiconductor wafer. It is to be understood the die 40 has been previously processed and may have any type of device or semiconductor devices already defined within it. In FIG. 2*b* a plurality of metallic bumps are then applied in a predefined pattern on upper surface 44 of die 40 to provide contact to connection points on die 40. The solder layers 46 are then be disposed on each of bumps 42 to result in the structure shown in FIG. 2*c*.

Figure 3A:
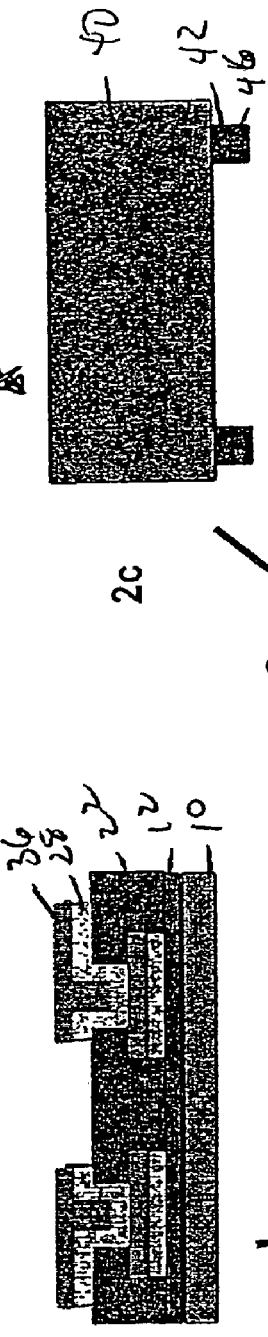
Figure 3A:
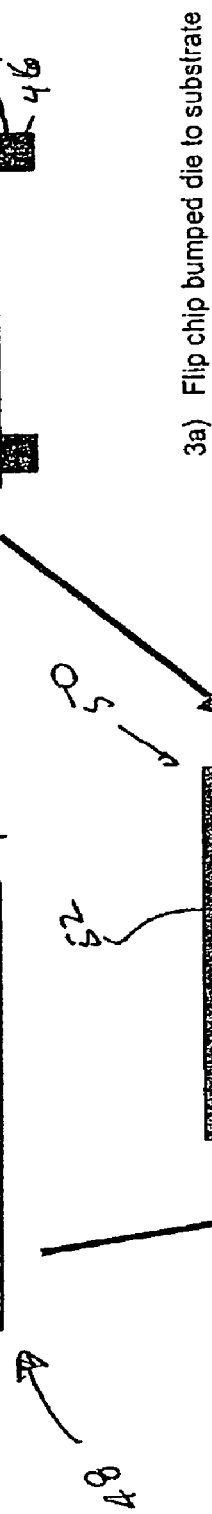
Figure 3A:
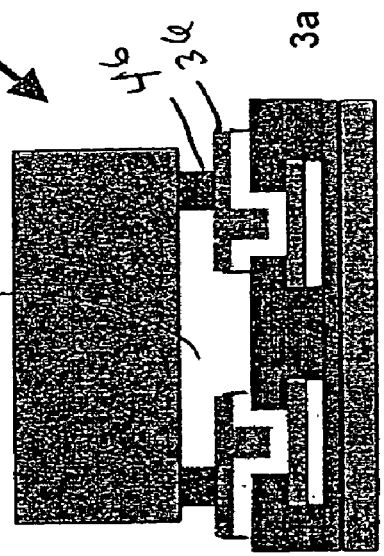
Figure 3A:
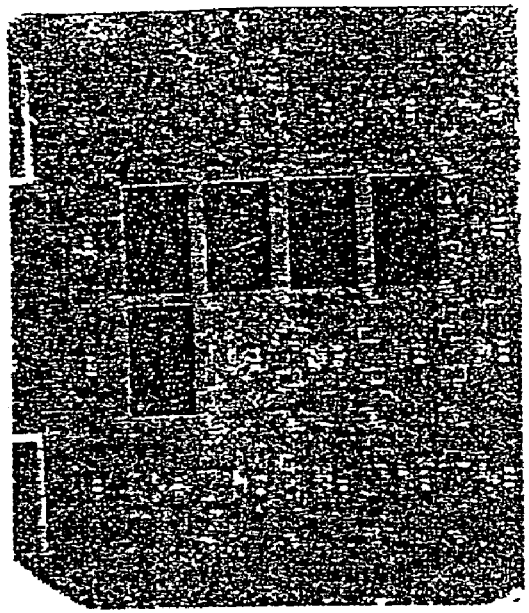

FIG. 3*a* illustrates the flip chip bonding steps of the invention. The intermediate structure, as shown in the completed step in FIG. 1*n*, is combined with the intermediate structure shown in the completed step of FIG. 2*c*. The structure of FIG. 1*n* is for the purposes of FIG. 3*a* denoted collectively by reference numeral 48. Similarly, the completed structure FIG. 2*c* is shown in FIG. 3*a* collectively denoted by the reference numeral 50. Die structure 50 is thus flipped and placed on top of interconnect structure 48 as depicted in FIG. 3*a*. The solder bumps 46 had been devised so they are aligned with gold contact pads 36. The flip structures are then bonded together to make secure mechanical and electrical connection at their points of contact.

The process continues with the steps shown in FIG. 3*b*. The open space 52 between die structure 50 and interconnect structure 48 shown in FIG. 3*a* is filled with an insulating material 54 such as an epoxy underfill. Thereafter the entire bonded and completed structure as shown in FIG. 3*b* is potted with conventional potting material to form a monolithic passivated package as shown in FIG. 3*c*.

Figures 3G, 3H, 3I:
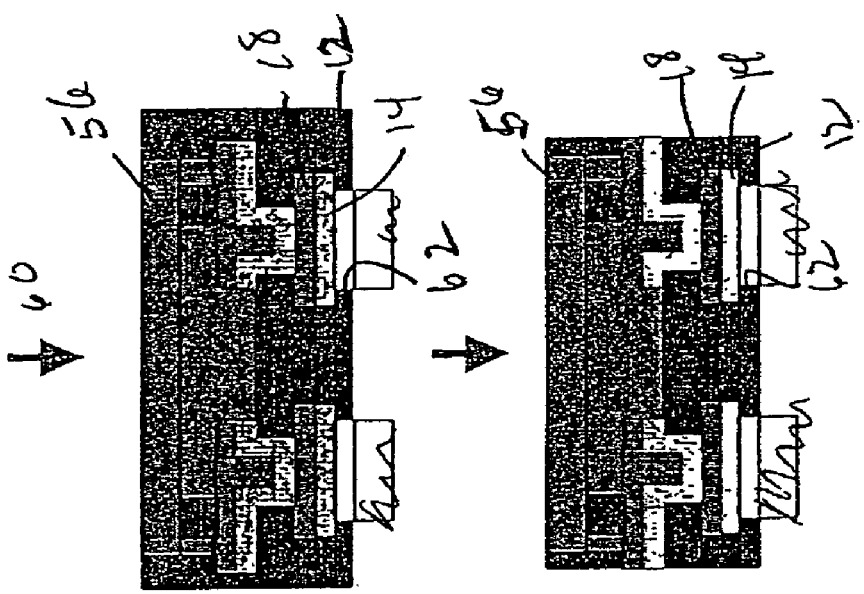

Potted die structure 50 is thinned by grinding or other means to the desired final thickness forming a thin semiconductor wafer 56 as shown in FIG. 3*d*. Active semiconductor devices remain unaffected in the non-thinned or remaining portion of wafer 56. Aluminum layer 10, which has served the purpose of a structural substrate during the construction steps is then released by conventional means in step 3*e* and removed leaving polyimide layer 12 as the lowermost layer of the device as depicted in FIG. 3*e*. A masking layer 58 of photoresist is then disposed on polyimide layer 12 as shown in FIG. 3*f* and is photolithographically imaged to define openings 60 which will serve to provide the structure for the test pads 14, 18. The exposed polyimide layer 12 in openings 60 is then etched away to expose field layer metal 14 of gold pads 18. Etched mask 58 is then removed as shown in FIG. 3*h*. This then allows the semiconductor devices in thinned wafer 56 to be accessed and tested through test pads 14, 18 through openings 62 in polyimide layer 12.

It is to be understood that although the figures show a single potted die, the processing steps up to this point are actually conducted simultaneously with a plurality of identical devices which have been supported by aluminum shim layer 10 until the step of FIG. 3*e* when layer 10 is removed. With integrated circuit dies 56 having then been tested in FIG. 3*h* while still included in a collective assembly, the wafers are then diced, thereby releasing each of the individual packaged dies 56 from each other as shown in the final step of FIG. 3*i*.

FIG. 4*a* is a diagrammatic side cross-sectional view of a further embodiment of the reverse neo process for high-volume fabrication. In FIG. 4*a* a first set of wafers, generally to know by reference numeral 70, is processed along with a second wafer 72. An interconnect layer 74, such as described in connection FIGS. 1*a*-1*n* is prepared and prepackaged chip devices 76 are then flip bonded to interconnect layer 74. In the illustrated embodiment of FIG. 4*a* the first wafer 70 includes a flash and SRAM memory chip and the second wafer includes an ASIC chip. It is of course to be understood that any number and kind of the packaged integrated circuit chips may be employed. The epoxies are cured, the device underfilled and the transfer devices are molded to form the electronics packaged using potting 78 in the manner as described above.

In the illustration of FIG. 4*b* the two wafers of FIG. 4*a* are combined. Any carriers which may be present on either wafer is released from the wafer substrate and the two wafers are attached or epoxied together as shown in FIG. 4*b*. In the illustrated embodiment, wafers 70 and 72, which now form a collective package or stack that is denoted by reference normal 80, are cut or sawn into strips.

As shown in the illustration of FIG. 4*c* the metalization within interconnect layers 74 are then connected together in a conventional manner through metalization 82 defined on side surface 84 of stack 80. Numerous patents of the assignee of the present invention describe side connection technologies for vertical stacks of prepackaged devices. The upper surface of wafer 70 as shown in FIG. 4*d* of stack 80 is then thinned by grinding or other equivalent means. The lower portion of stack 80, wafer 72, is then solder bumped as shown in FIG. 4*e*, thereby providing a plurality of solder bumps 84 available for subsequent electrical connection. The strip of stacked wafers are then singulated or sawed into individual stacks 80 and are made available for subsequent processing or immediate installation.

It can now be appreciated that a packaged chip made according to the invention enjoys several advantages. For example, the fabrication of the interconnect assembly 48 of FIG. 1*n* is isolated and independent of the fabrication of the chip assembly 50 of FIG. 2*c* so that chip assembly 50 are not subjected to the higher processing temperatures used in fabricating interconnect assembly 48. This is important, for example, where chip assembly 50 is a superconducting chip and is made of materials which cannot withstand conventional manufacturing temperatures.

Further, any failures or loss of yields in making the interconnect assembly 48 of FIG. 1*n* are not imposed on yields of the more expensive chip assembly 50. In other words, interconnect assembly 48 is fully tested and passed before bonding to chip assembly 50 in FIG. 3*a*, thereby increasing overall yields of the process.

Still further, the process lends itself to a fabrication technology in which a larger number of dies at higher densities can be simultaneously processed than was possible with the prior neo-wafer processes.

Finally, the methodology of the invention lends itself to an increase in the number of metalization layers within interconnect assembly 48 that can be realized as compared to the prior neo-wafer processes.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim.

Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

We claim:

1. An electronic package comprising: a stack of at least two layers wherein each of said layers is comprised of
    at least one pre-formed integrated circuit chip;
    a pre-tested interconnect assembly formed separately from said pre-formed integrated circuit chip having at least one test pad formed therein;
    a plurality of conductive bumps connected to the terminals of the at least one pre-formed integrated circuit chip; and
    a passivating layer disposed about said pre-tested interconnect assembly and said pre-formed integrated circuit chip, wherein at least two of said pre-formed integrated circuit chips on separate layers share a common electrical connection and wherein at least one side of said test pad is accessible for electrically testing the functionality of said pre-formed integrated circuit chip.

2. The package of claim 1 wherein said common electrical connection is comprised of a T-connect formed by metalization on at least one side of said package.

* * * * *

UNITED STATES PATENT AND TRADEMARK OFFICE
CERTIFICATE OF CORRECTION

| | | |
|---|---|---|
| PATENT NO. | : 7,239,012 B2 | Page 1 of 1 |
| APPLICATION NO. | : 10/951990 | |
| DATED | : July 3, 2007 | |
| INVENTOR(S) | : Pepe et al. | |

It is certified that error appears in the above-identified patent and that said Letters Patent is hereby corrected as shown below:

In Column 4, Line 66:
Delete the words "Photo resist layer 25" and replace it with the words --Photoresist layer 24--.

In Column 4, Line 67:
Delete reference numeral "20" and replace it with reference numeral --22--.

In Column 5, Line 1:
Delete reference numeral "24" and replace it with reference numeral --22--.

In Column 5, Line 1:
Delete reference numeral "22" and replace it with reference numeral --24--.

Column 8, Line 25:
Insert the words --at least one-- between the words "said" and "pre-formed".

Column 8, Line 27:
Delete the word "the" after the word "to."

Column 8, Line 31:
Insert the words --at least one-- between the words "said" and "pre-formed".

Column 8, Line 32:
Insert the words --at least one-- between the words "said" and "pre-formed".

Column 8, Line 36:
Insert the words --at least one-- between the words "said" and "pre-formed".

Signed and Sealed this
Third Day of May, 2011

David J. Kappos
*Director of the United States Patent and Trademark Office*